United States Patent [19]

Matsui

[11] Patent Number: 4,640,639
[45] Date of Patent: Feb. 3, 1987

[54] PRINTED CIRCUIT BOARD HOLDING APPLIANCE

[75] Inventor: Kazuhiro Matsui, Toyoake, Japan

[73] Assignee: Kitagawa Industries Co., Ltd., Nagoya, Japan

[21] Appl. No.: 679,071

[22] Filed: Dec. 6, 1984

[30] Foreign Application Priority Data

Feb. 13, 1984 [JP]  Japan .............................. 59-19492[U]

[51] Int. Cl.$^4$ .......................... F16B 1/00; H01B 17/00
[52] U.S. Cl. ...................................... 403/24; 403/348; 403/407.1; 174/138 D
[58] Field of Search ................... 403/348, 349, 24, 25, 403/405, 406, 407, 1, 27, 383; 174/138 D

[56] References Cited

U.S. PATENT DOCUMENTS

| | | | |
|---|---|---|---|
| 1,091,212 | 3/1914 | Gregory | 403/349 |
| 1,263,050 | 4/1918 | Fargo | 403/349 |
| 2,367,458 | 1/1945 | Coplen | 403/348 |
| 2,543,881 | 3/1951 | Umphlette et al. | 403/405 |
| 3,854,374 | 12/1974 | Boyle et al. | 174/138 D |
| 4,007,516 | 2/1977 | Coules | 174/138 D |
| 4,176,815 | 12/1979 | Davidson et al. | 403/349 |
| 4,427,316 | 1/1984 | Moore et al. | 403/407 |
| 4,462,621 | 7/1984 | Chapman | 403/348 |
| 4,470,178 | 9/1984 | Matsui | |
| 4,495,548 | 1/1985 | Matsui | |

FOREIGN PATENT DOCUMENTS 1568210  5/1980  United Kingdom ............... 403/349

Primary Examiner—Cornelius J. Husar
Assistant Examiner—Peter M. Cuomo
Attorney, Agent, or Firm—Oblon, Fisher, Spivak, McClelland, & Maier

[57] ABSTRACT

According to the printed circuit board holding appliance of the present invention, a plurality of the holding appliances each comprising a spacing holding member and a fitting member can be connected vertically continuously through each tapered lower end portion. On transporting, therefore, plural printed circuit boards can be temporarily fixed easily by merely stacking and conveyed without being rattled by temporal fixing. Besides, since the vertical connection or the temporary fixation of the board holding appliances can be done easily, the printed circuit boards in a stacked state can be fixed also to a support member easily and firmly with a mounting screw.

7 Claims, 9 Drawing Figures

PRINTED CIRCUIT BOARD HOLDING APPLIANCE

BACKGROUND OF THE INVENTION

1. Field of the Invention

The present invention relates to a printed circuit board holding appliance for mounting printed circuit boards to a support member of an electronic device or the like at predetermined intervals, especially to a printed board holding appliance capable of temporarily fixing printed circuit boards in a stacked state.

2. Description of the Prior Art

Heretofore, as a printed circuit board holding appliance for mounting printed circuit boards 6 to a support member of an electronic device or the like at predetermined intervals, a so-called spacer bush formed of a synthetic resin and comprising a fitting cylinder 2 having a cylindrical end 1 of a smaller diameter and fitting ring 4 as shown in FIG. 1, or comprising a fitting cylinder 8 having a cylindrical end 7 of a smaller diameter and a fitting ring 5 as shown in FIG. 2, has been proposed, in Japanese Utility Model Publication Nos. 8235/81 and 17996/81.

However, the above spacer bush, wherein each of the fitting cylinders 2 or 8 making a pair with each of said fitting rings 4 or 5, can not be stacked one upon the other, so in the case of transporting plural printed circuit boards 6 in a stacked state, it is necessary to fix them with machine screws or the like. To avoid such inconvenience, it has been desired to develop printed circuit board holding appliance capable of temporarily fixing plural printed circuit boards easily by merely stacking them.

SUMMARY OF THE INVENTION

It is an object of the present invention to provide a printed circuit board holding appliance capable of temporarily fixing plural printed circuit boards easily by merely stacking them and transporting them without them being rattled in this stacked state.

It is another object of the present invention to provide a printed circuit board holding appliance capable of easily and firmly fixing printed circuit boards in a stacked state to a support member with a mounting screw.

To achieve the above-mentioned objects, the printed circuit board holding appliance of the present invention comprises a spacing holding member having a shaft-like protrusion extending from a first end portion thereof and a fitting hole extending parallel to the longitudinal axis of the spacing holding member, and a fitting member having a shaft portion capable of being fitted in the fitting hole of the spacing holding member and a flange portion formed at the upper part of the shaft portion and an insertion hole extending parallel to the longitudinal axis protrusion of the spacing holding member being fitted in a mounting hole formed in a printed circuit board, and the lower end portion of the spacing holding member being formed in a downwardly tapered shape.

DESCRIPTION OF THE PREFERRED EMBODIMENTS

Embodiments of the present invention will be described hereinunder on the basis of the drawings.

Figure 1:
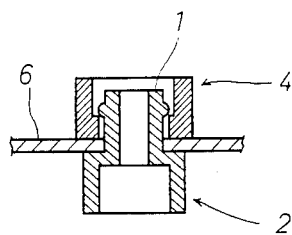
FIGS. 1 and 2 are sectional views of conventional printed circuit board holding appliances.
Figure 2:
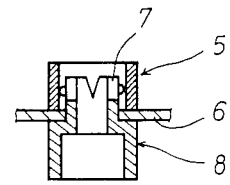
Figure 3:
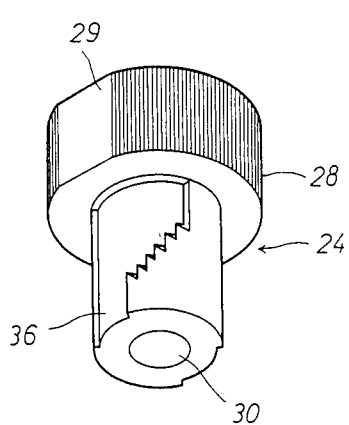
FIG. 3 is a perspective view of a fitting member according to an embodiment of the present invention.
Figure 4:
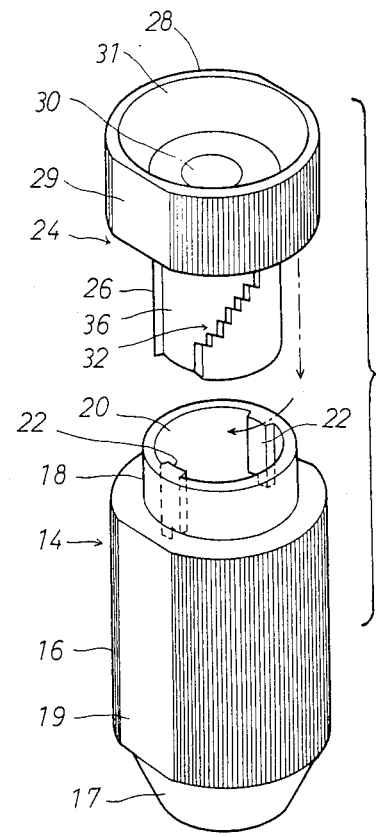
FIG. 4 is a perspective view of the fitting member and a spacing holding member.
Figure 4A:
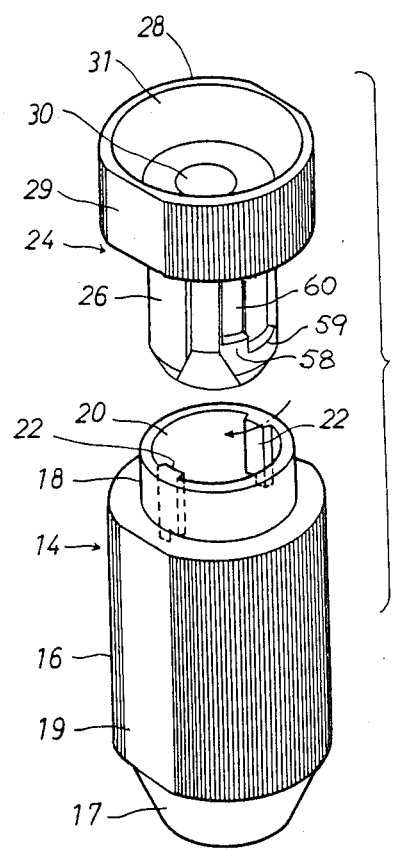
FIG. 4A is a perspective view of another fitting member and spacing holding member.
Figure 9:
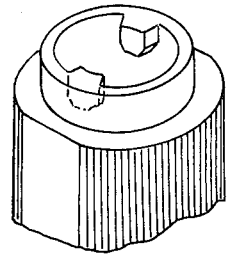

FIG. 3 is a perspective view of a fitting member 24 and FIGS. 4 and 4A are perspective views of the fitting member 24 and a spacing holding member 14 in which the fitting member 24 is to be fitted. The spacing holding member 14 has a spacing holding portion 16, a shaft-like protrusion 18 of a circular cross-section formed at one end portion of the spacing holding portion 16 and a fitting through hole 20 extending parallel to the longitudinal axis of the spacing holding member. Further, on the protrusion 18 side of the fitting hole 20 are formed a pair of retaining projections 22 positioned symetrical with respect to the axis of the fitting hole (20), having saw tooth like portion extending from one end of each of the retaining projection 22. The protrusion 18 is fitted in a mounting hole formed in a printed circuit board, and its height is equal or less than the thickness of the printed circuit board.

Figures 6, 7:
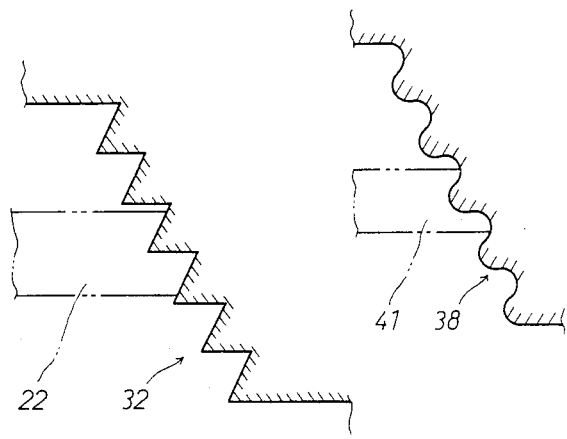
FIGS. 6 and 7 are views explaining engaged conditions of retaining teeth of the fitting member.

The fitting member 24 comprises a shaft portion 26, a flange portion 28 formed at one end of the shaft portion 26 and a mounting screw inserting through hole 30 extending parallel to the longitudinal axis of the fitting member, the flange portion 28 being formed with a taper 31 having a diameter larger than that of the insertion hole. The shaft portion 26 is capable of being fitted in the fitting hole 20, and on the outer peripheral portion of the shaft portion 26 are formed a pair of continuous retaining teeth 32 being symmetrical with respect to the longitudinal axis, the retaining teeth 32 being engageable with the retaining projections 22 of the spacing holding member. More specifically, each tooth tip of the retaining teeth 32 faces the flange portion 28, and between the retaining teeth 32 and an end face of the flange portion 28 are formed recess portions 36, the diameter of which is smaller than that of the shaft portion 26, owing to the provision of stepped portions 26. One end of each recess portion 36 is positioned so as to have a predetermined distance in an arcuate direction from both ends of the retaining teeth 32 at the open end of the shaft portion 26. Consequently, a pair of retaining projections 22 can be fitted in a pair of recessed portions 36, and in its fitting range, it is possible to make mutual rotational engagement between the fitting member 24 and the spacing holding member 14. As shown in the developed elevational view of FIG. 6, one side of each saw tooth of the retaining teeth 32 is parallel to the longitudinal axis of the fitting member 24 so as to be engageable with the retaining projection 22. This disposing direction of retaining teeth ensures the engagement even under impact or the like. The disposing direction of the plural retaining teeth is diagonal so that the distance between lower end face of the flange portion 28 and upper end face of the protrusion 18, namely, the gap which permits the printed circuit board to be held therein, is adjustable according to mutual rotation of the fitting member 24 and the spacing holding member 14. Thus, the mutual rotation of both members 14 and 24 permits the printed circuit board to be held therebetween and temporarily fixed to the holding appliance. Such a gap adjustment enables the printed circuit board holding appliance to hold the printed circuit boards of different thickness made according to various standards. In place of the retaining teeth 32 and retaining projection 22, arcuate retaining teeth 38 and retaining projection 41 may as well be used as shown in FIG. 7. The retaining projection may be cylindrical. Since the each retaining tooth is engageable with the retaining projection, the engagement is firm enough to prevent loosening even under impact or the like. For disengagement, all that is required is merely rotating the spacing holding member 14 and the fitting member 24 while applying a certain force therebetween. Easy disengagement is obtainable because the retaining teeth are actually not so large. Thus, the above arrangement is advantageous in that the printed circuit board can be clamped firmly and removed easily.

A further advantage of the printed circuit board holding appliance is that the retaining teeth may be formed on an outer side of the spacing holding member and the retaining projections on an inner side of the fitting member.

The tapered lower end portion 17 extends downward from the lower end of the spacing holder member 14. The tapered hole 31 on the upper portion of the fitting member 24 is formed so that the tapered lower end portion of the holding member 14 can be fitted therein. Therefore, a still further advantage is that plural printed circuit board holding appliances comprising the spacing holding member 14 and its fitting member 24 may be connected by vertical stacking.

Further, on the outer peripheries of the spacing holding member 14 and fitting member 24 are formed knurls 50 for easy gripping and slidable rotation at the time of fitting, and on the outer peripherial face of the flange portion and spacing holding member are formed opposed chamfered portions (19, 29) which become aligned to show the right position where retaining projections (22) are fitted in and come into recess portion (36) engagement with at the time of fitting of the two. The chamfered portions 19 and 29 also serve as a non-slip means when gripped with fingers.

The printed circuit board holding appliance of the above construction is used as follows. First, the protrusion 18 of the spacing holding member 14 is inserted from below into a mounting hole of each printed circuit board 40, then the shaft portion 26 of the fitting member 24 is inserted from above into the fitting hole 20 of the protrusion 18, and the fitting member 24 is rotated in a clockwise direction, so that the retaining projections 22 formed in the fitting hole 20 of the spacing holding member 14 are brought into engagement with the retaining teeth 32 of the shaft portion of the fitting member 24, and the spacing holding member 14 and the fitting member 24 are fitted firmly, while holding the printed circuit board 40 therebetween.

In transporting the printed circuit board 40 thus held by the holding appliance 40, a large number of the printed circuit boards can be stacked to be fixed temporarily by fitting the tapered lower end portion 17 of the spacing holding member 14 in one pair into the upper tapered portion 31 of the fitting member 24 in another pair, and can be transported in such a temporarily file fixed state while not being rattled, even without using fixing machine screws or the like. It goes without saying that the upper hole 31 of the fitting member 24 is not restricted to the tapered hole, although other shapes of holes may cause a slight rattling.

Figure 5:
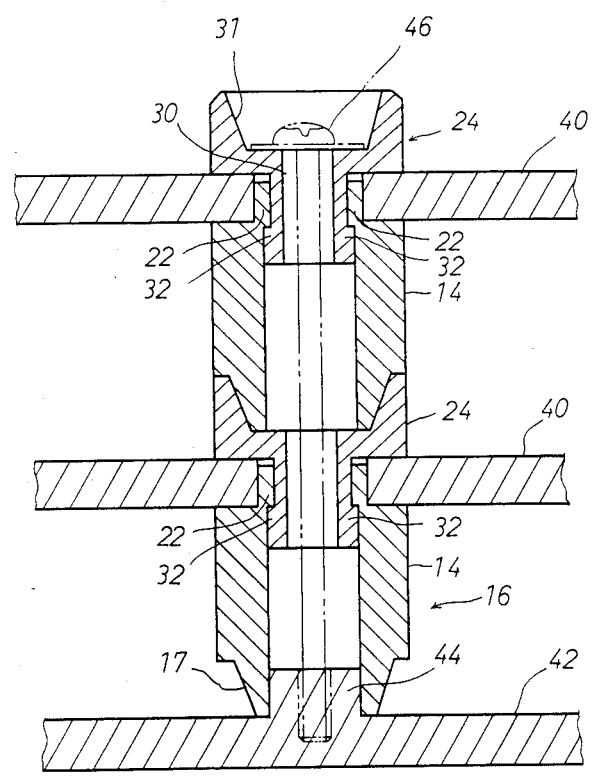
FIG. 5 is a sectional view showing a mounted state.

In case of fixing plural printed circuit boards 40 to a support member 42 of an electronic device or the like by stacking, as shown in FIG. 5, a mounting screw 46 is vertically inserted through the insertion holes 30 of the fitting members 24 which are connected in vertical, and its lower end is inserted into a projection 44 which is fitted in the spacing holding member 14 located in the lowest position and extending from the support member 42. Thus, the stacked printed circuit boards 40 can be firmly held in place.

Figure 8:
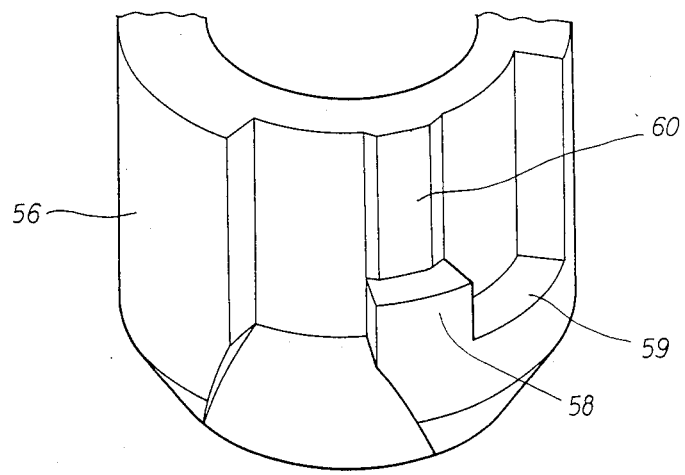
FIG. 8 is a perspective view showing a part of another embodiment of the present invention.

FIG. 8 illustrates a detail of FIG. 4A of the present invention, in which a shaft portion 56 of a fitting member is not provided with such continuous stepped retaining teeth 32 as is provided in the above embodiment, and instead provided with a retaining projection 58 and a stepped portion 59 extending lower than the projection 58, which are temporarily engageable with the retaining projection 22. As in the case of the of first embodiment having the continuous stepped retaining teeth 32, there is a possibility that a repeated mutual rotation of the fitting member 24 and the spacing holding member 14 will cause rubbing together and wearing away of retaining teeth 32. But, in this embodiment there is no such fear. Further, a land 60 is formed extending parallel to the longitudinal axis of the shaft portion 56. Consequently, there occurs a click sound upon contacting with the retaining projection 22 at the time of mutual rotation of the fitting member 24 and the spacing holding member 14. Thus, the mutual rotation is permitted when the click sound occurred.

What is claimed is:

1. A printed circuit board holding appliance comprising:
   a spacing holding member having a shaft-like protrusion extending from an upper end thereof and a fitting hole extending through said holding member and protrusion parallel to the longitudinal axis thereof; and
   a fitting member having a shaft portion fittable in said fitting hole and a flange portion formed on the upper end of said shaft portion, and an insertion hole extending through said fitting member parallel to a longitudinal axis thereof, wherein said protrusion of said spacing holding member is fittable in a mounting hole formed in a printed circuit board, and a lower end portion of the spacing holding member is formed in a downwardly tapered shape.

2. A printed circuit board holding appliance according to claim 1, wherein cylindrical projections forming first retaining projections extend from the inner surface of said shaft like protrusion, and wherein said shaft portion has second retaining projections and stepped portions which extend lower than said second retaining projections for temporary engagement with said first retaining projections.

3. A printed circuit board holding appliance according to claim 1, wherein a plurality of spacing holding members and their fitting members can be connected by vertical stacking.

4. A printed circuit board holding appliance according to claim 2, wherein a land (60) is formed in parallel to the axis of the shaft portion (56).

5. A printed circuit board holding appliance according to claim 1, wherein the shaft-like protrusion is formed at one end of a spacing holding portion of the spacing holding member and has a circular cross-section and a height no greater than the thickness of the printed circuit board, wherein a pair of first retaining projections symmetrical with respect to the longitudinal axis of the fitting hole are formed on an inner surface of the fitting hole, wherein saw tooth like portions extend from one end of each of said first retaining projections, and wherein said shaft portion has a second retaining portion and a stepped portion which extends lower than said second retaining projection, the second retaining projection and the stepped portion being temporarily engageable with the first retaining projection.

6. A printed circuit board holding appliance according to claim 2, including knurls on the outer peripheral portions of the spacing holding member and the fitting member, wherein opposed flat chamfered portions are formed on a peripheral face of the flange portion and spacing holding member at positions for showing where said retaining projections are to be fitted in for coming into engagement with said stepped portion when the fitting member is fitted in the spacing holding member, the chamfered portions serving also as non-slip means when gripped with fingers.

7. A printed circuit board holding appliance according the claim 5, including a land formed in parallel to the axis of the shaft portion.

* * * * *